United States Patent
Kumakura et al.

(10) Patent No.: US 9,741,472 B2
(45) Date of Patent: Aug. 22, 2017

(54) METHOD FOR MANUFACTURING $MGB_2$ SUPERCONDUCTOR, AND $MGB_2$ SUPERCONDUCTOR

(71) Applicant: NATIONAL INSTITUTE FOR MATERIALS SCIENCE, Ibaraki (JP)

(72) Inventors: Hiroaki Kumakura, Ibaraki (JP); Akiyoshi Matsumoto, Ibaraki (JP); Shujun Ye, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 0 days.

(21) Appl. No.: 15/105,114

(22) PCT Filed: Dec. 16, 2014

(86) PCT No.: PCT/JP2014/083257
§ 371 (c)(1),
(2) Date: Jun. 16, 2016

(87) PCT Pub. No.: WO2015/093475
PCT Pub. Date: Jun. 25, 2015

(65) Prior Publication Data
US 2016/0314877 A1 Oct. 27, 2016

(30) Foreign Application Priority Data
Dec. 17, 2013 (JP) ................................. 2013-259711

(51) Int. Cl.
*H01B 12/06* (2006.01)
*C01B 35/04* (2006.01)
(Continued)

(52) U.S. Cl.
CPC ............ *H01B 12/06* (2013.01); *C01B 35/04* (2013.01); *H01B 13/0016* (2013.01);
(Continued)

(58) Field of Classification Search
CPC .................................. H01B 12/06; C01B 35/04
See application file for complete search history.

(56) References Cited

U.S. PATENT DOCUMENTS

2008/0274902 A1* 11/2008 Yamada ............... H01L 39/141
505/231
2013/0012395 A1 1/2013 Tanaka et al.
2014/0066313 A1 3/2014 Tanaka et al.

FOREIGN PATENT DOCUMENTS

JP 2004-307256 11/2004
JP 2007-59261 3/2007
(Continued)

OTHER PUBLICATIONS

Giunchi et al. "High performance new MgB2 superconducting hollow wires" Supercond. Sci. Technol. 16 (2003) 285-291.*
(Continued)

*Primary Examiner* — Paul Wartalowicz
(74) *Attorney, Agent, or Firm* — Wenderoth, Lind & Ponack, L.L.P.

(57) ABSTRACT

Provided are a method for manufacturing $MgB_2$ superconductor by pressure molding a mixture of Mg powder or $MgH_2$ powder and B powder and heat-treating the mixture, the method including (I) a step of adding a polycyclic aromatic hydrocarbon to the B powder, while heating the mixture to a temperature higher to or equal to the melting point of the polycyclic aromatic hydrocarbon at the time of this addition, and thereby covering the surface of the B powder with the polycyclic aromatic hydrocarbon; and (II) a step of mixing the B powder having the surface covered with the polycyclic aromatic hydrocarbon, with the Mg powder or the $MgH_2$ powder, or a step of combining the B powder having the surface covered with the polycyclic aromatic hydrocarbon, with an Mg rod; and an $MgB_2$ superconducting wire which has high critical current density (Jc) characteristics and less fluctuation in the critical current density (Jc).

6 Claims, 11 Drawing Sheets

(51) Int. Cl.
    *H01F 6/06*     (2006.01)
    *H01L 39/24*     (2006.01)
    *H01B 13/00*     (2006.01)

(52) U.S. Cl.
    CPC .......... *H01B 13/0036* (2013.01); *H01F 6/06* (2013.01); *H01L 39/2487* (2013.01)

(56) References Cited

FOREIGN PATENT DOCUMENTS

| | | |
|---|---|---|
| JP | 2008-235263 | 10/2008 |
| JP | 2013-16396 | 1/2013 |
| JP | 2013-197072 | 9/2013 |
| WO | 2007/049623 | 5/2007 |

OTHER PUBLICATIONS

International Search Report issued Mar. 24, 2015 in International Application No. PCT/JP2014/083257.

H. Yamada et al., Effect of aromatic hydrocarbon addition on in situ powder-in-tube processed MgB2 tapes, Supercond. Sci. & Technol., 19 (2006), 175.

H. Yamada et al., "The excellent superconducting properties of in situ powder-in-tube processed $MgB_2$ tapes with both ethyltoluene and SiC powder added", Supercond. Sci. & Technol., 20 (2007), L30.

S.J. Ye et al., "Enhancement of the critical current density of internal Mg diffusion processed $MgB_2$ wires by the addition of both SiC and liquid aromatic hydrocarbon", Physica C 471 (2011), 1133-1136.

* cited by examiner

F I G . 1
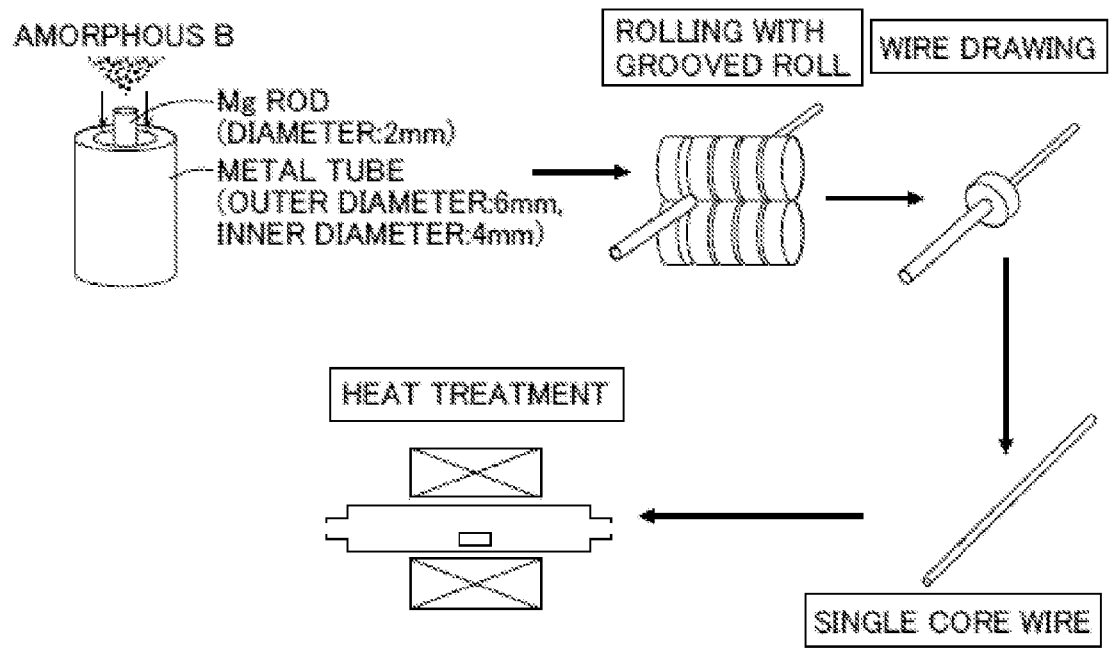

F I G. 4
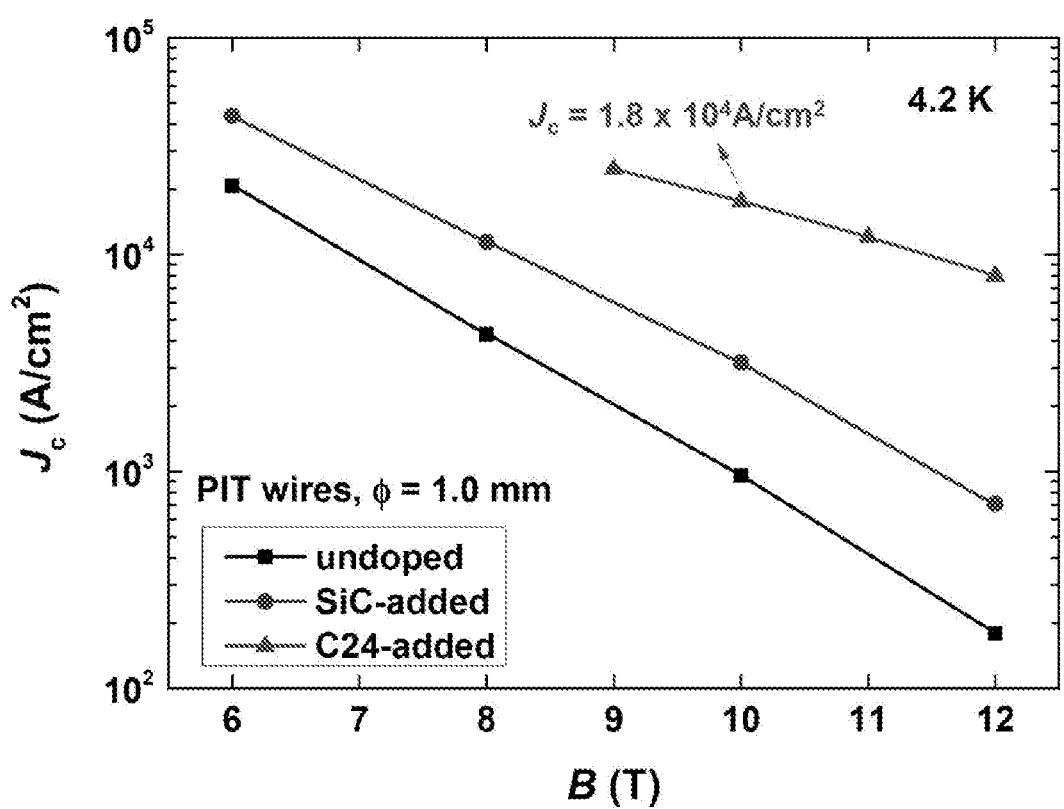

F I G.5
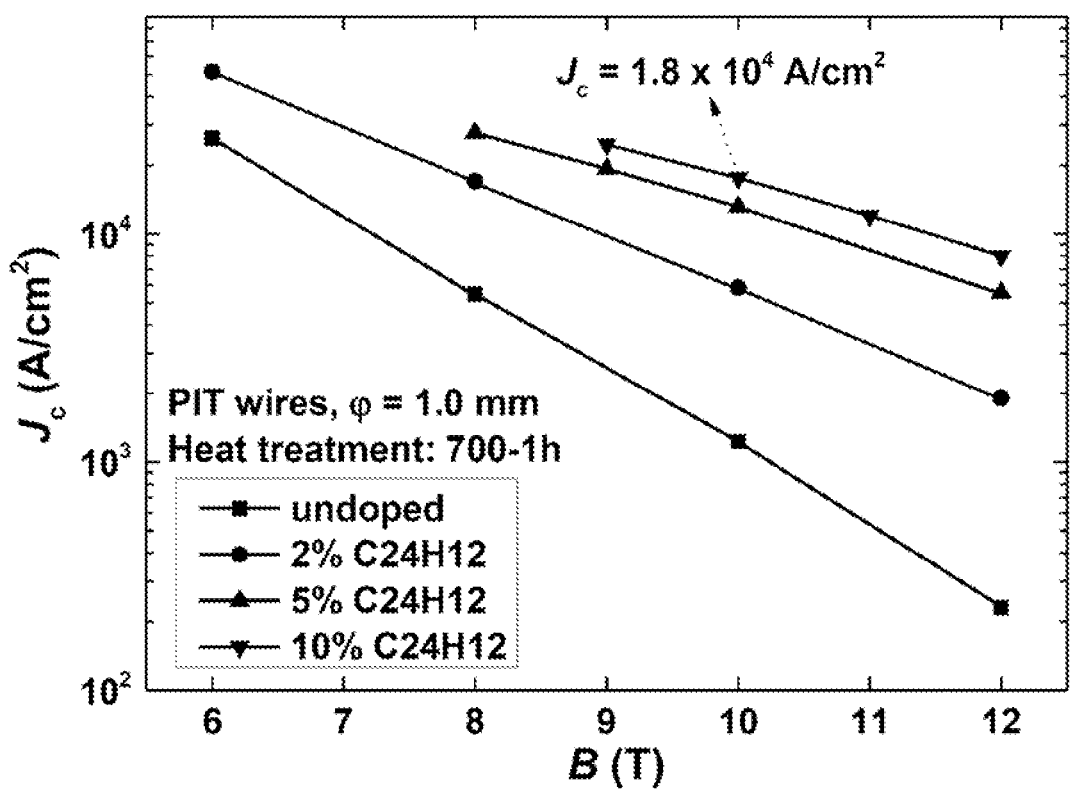

F I G. 6
(a) Coronene
(or superbenzene)
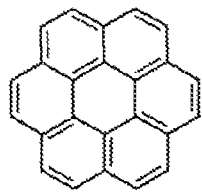
(b) Anthanthrene
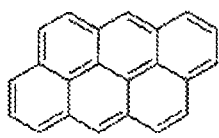
(c) Benzo(*ghi*)perylene
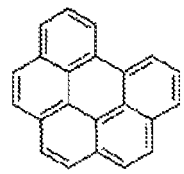
(d) Circulene
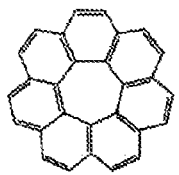
(e) Corannulene
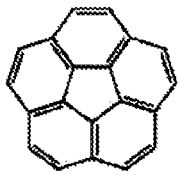
(f) Dicoronylene
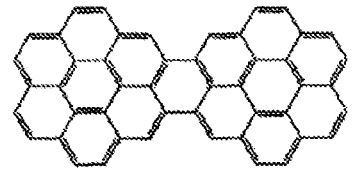

F I G. 7
(g) Diindenoperylene  (h) Helicene  (i) Heptacene
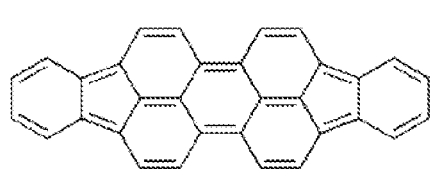 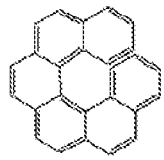 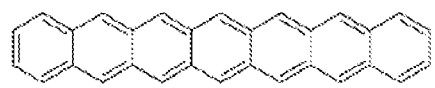
(k) kekulene
(j) Hexacene  (l) Ovalene
 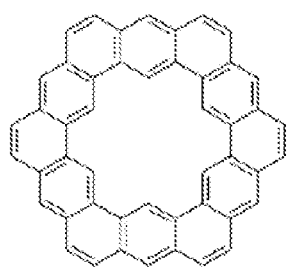 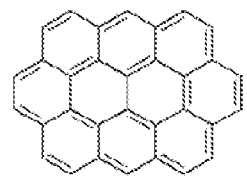

FIG.8

(m) Zethrene  (n) Benzopyrene  (o) Benzo(a)pyrene (p) Benzo(*e*)pyrene  (q) Benzo(a)fluoranthene  (r) Benzo(*b*)fluoranthene F I G. 9
(s) Benzo(j)fluoranthene
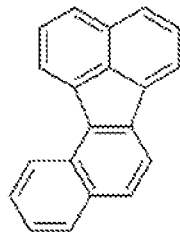
(t) Benzo(k)fluoranthene
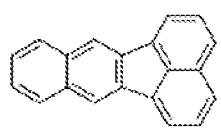
(u) Dibenz(a,h)anthracene
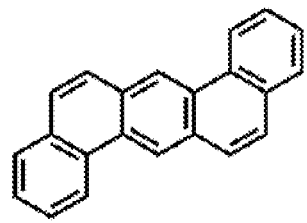
(v) Dibenz(a,j)anthracene
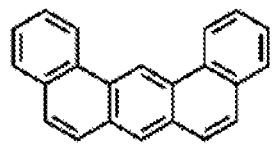
(w) Olympicene
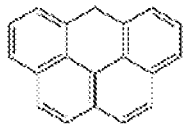
(x) Pentacene

F I G . 1 0
(y) Perylene
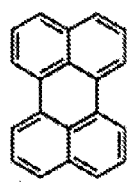
(z) Picene
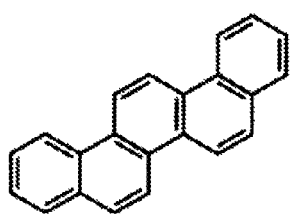
(aa) Tetraphenylene
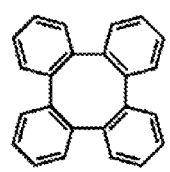
(ab) Benz(a)anthracene
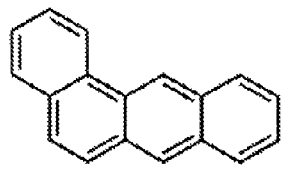
(ac) Benzo(a)fluorene
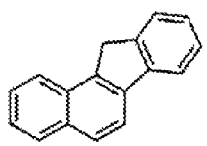
(ad) Benzo(c)phenanthrene
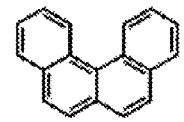

F I G . 1 1
(ae) Chrysene
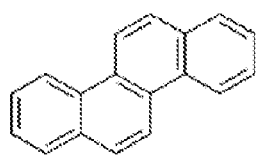
(af) Fluoranthene
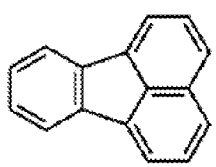
(ag) Pyrene
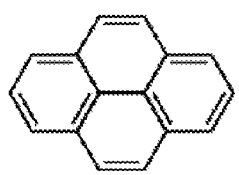
(ah) Tetracene
(ai) Triphenylene
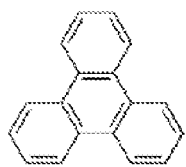
(aj) Anthracene
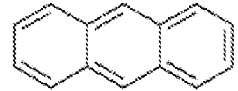
(ak) Fluorene
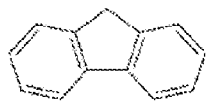
(al) Phenalene
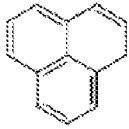
(am) Phenanthrene
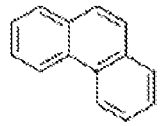

METHOD FOR MANUFACTURING $MgB_2$ SUPERCONDUCTOR, AND $MgB_2$ SUPERCONDUCTOR

TECHNICAL FIELD

The present invention relates to a method for manufacturing $MgB_2$ superconductor, and to $MgB_2$ superconductor. More particularly, the present invention relates to a method for manufacturing $MgB_2$ superconductor having a high critical current density (Jc) that is useful for enhancing the capacity of superconducting linear motor cars, MRI medical diagnostic apparatuses, semiconductor single crystal pulling apparatuses, superconducting energy storages, superconducting rotating machines, superconducting transformers, superconducting cables and the like, and to $MgB_2$ superconductor.

BACKGROUND ART $MgB_2$ superconductor has a high critical temperature Tc compared to practically used superconducting materials, and also has advantages such as follows in view of practical use.

i) On the occasion of passing a large superconducting current from one crystal grain to a neighboring crystal grain, it is considered that alignment (orientation) of crystal grains such as in the case of high temperature oxide superconductors is unnecessary;

ii) the material is abundant in resources, and the raw materials are relatively inexpensive;

iii) the material is mechanically tough; and iv) the material is lightweight.

Accordingly, $MgB_2$ superconductor is considered to be promising as a practically useful material, and research and development on this material is currently in progress.

On the other hand, for the practicalization of superconducting materials, so-called wire fabrication must be achieved; however, regarding the method for fabricating $MgB_2$ wire, a so-called powder-in-tube (PIT) method in which a metal tube is packed with a raw material powder, the raw material powder is processed into wire, and then the wire is heat treated, is most generally used (see Patent Literature 1). However, $MgB_2$ superconducting wire produced by the PIT method has a serious problem that the critical current density Jc, which is the most important for practical use, is far below the level for practical use.

For this reason, various attempts have been made to enhance the Jc characteristics through an increase in the packing density, addition of impurities, and the like (see Non Patent Literatures 1 to 3). Among these, in regard to the addition of impurities, addition of impurities including carbon has been hitherto attempted many times. The most common additive is SiC nanoparticles, and it has been reported that the Jc characteristics in high magnetic fields are significantly enhanced through the addition of SiC nanoparticles. This is speculated to be because the addition of SiC induces substitution of some sites of B in $MgB_2$ crystals with C, and thereby, the upper critical magnetic field $H_{c2}$ is increased. However, there is a problem with the addition of SiC that $Mg_2Si$ remains as an impurity after a heat treatment, and a sufficiently high value of Jc is not obtained.

On the other hand, substitution of the sites of B with C also occurs as a result of addition of an aromatic hydrocarbon or the like, and enhancement of the Jc characteristics in a high magnetic field may be attained by a similar mechanism (see Patent Literatures 1 to 3). Then, since there is no remaining of impurities such as $Mg_2Si$ in the addition of an aromatic hydrocarbon, it is considered that it is therefore more advantageous in the increase of Jc. In a case in which the aromatic hydrocarbon is a liquid, the liquid covers the surfaces of B or the Mg particles, and thus a uniform mixture is obtained. However, in a case in which the aromatic hydrocarbon is a solid, with regard to the addition of this solid, mixing of an Mg+B mixed powder and a solid aromatic hydrocarbon is not necessarily achieved uniformly, even if a ball mill or the like is used. Therefore, there is a problem that it is difficult to obtain wire having less fluctuation in the Jc characteristics.

CITATION LIST

Patent Literatures

Patent Literature 1: WO 2007/049623 A1
Patent Literature 2: JP 2007-59261 A
Patent Literature 3: JP 2008-235263 A

Non Patent Literatures

Non Patent Literature 1: H. Yamada, et al., Effect of aromatic hydrocarbon addition on in situ powder-in-tube processed $MgB_2$ tapes, Supercond. Sci. & Technol., 19 (2006), 175.

Non Patent Literature 2: H Yamada, et al., The excellent superconducting properties of in situ powder-in-tube processed $MgB_2$ tapes with both ethyltoluene and SiC powder added, Supercond. Sci. & Technol., 20 (2007), L30.

Non Patent Literature 3: S. J. Ye, et al., Enhancement of the critical current density of internal Mg diffusion processed $MgB_2$ wires by the addition of both SiC and liquid aromatic hydrocarbon, Physica C471 (2011), 1133.

SUMMARY OF INVENTION

Technical Problem

It is an object of the present invention to provide an $MgB_2$ superconducting wire, with which addition of a polycyclic aromatic hydrocarbon to $MgB_2$ superconducting wire with excellent uniformity can be realized, and which has high critical current density (Jc) characteristics and less fluctuation in the critical current density (Jc).

Solution to Problem

As a unique finding made by the inventors of the present invention through a process of thorough investigation, the inventors found that when a solid polycyclic aromatic hydrocarbon and a B raw material powder are together heated in a vacuum, the polycyclic aromatic hydrocarbon melts and infiltrates into the B powder, and the surfaces of the B powder are uniformly covered by the polycyclic aromatic hydrocarbon. Thus, the inventors of the present invention applied this principle to the method for producing $MgB_2$ superconducting wire, and devised a technique of heating a solid polycyclic aromatic hydrocarbon to a temperature higher than or equal to the melting point and coating the surface of this B raw material powder with the polycyclic aromatic hydrocarbon. When a B powder coated with this polycyclic aromatic hydrocarbon is used as a raw material for the PIT method, uniform substitution of B sites with C occurs, and an $MgB_2$ wire having a high Jc and excellent uniformity of Jc can be obtained. In the case of the internal Mg diffusion method as well, superior Jc characteristics and excellent uniformity can be obtained by using this B powder coated with a polycyclic aromatic hydrocarbon as a raw material.

The present invention has been achieved based on the finding described above, and has the following features.

The method for manufacturing $MgB_2$ superconductor of the present invention is a method for manufacturing $MgB_2$ superconductor by pressure molding a mixture of Mg powder or $MgH_2$ powder and B powder and heat-treating the mixture, the method including (I) a step of adding a polycyclic aromatic hydrocarbon to the B powder, while at the time of this addition, heating the mixture to a temperature higher than or equal to the melting point of the polycyclic aromatic hydrocarbon, and thereby covering the surface of the B powder with the polycyclic aromatic hydrocarbon in a liquid state; and (II) a step of mixing the B powder having its surface covered with the polycyclic aromatic hydrocarbon, with the Mg powder or the $MgH_2$ powder.

In the method for manufacturing $MgB_2$ superconductor, it is preferable that the polycyclic aromatic hydrocarbon is at least one selected from coronene, anthanthrene, benzo(ghi)perylene, circulenes, corannulene, dicoronylene, diindenoperylene, helicene, heptacene, hexacene, kekulene, ovalene, zethrene, benzo[a]pyrene, benzo[e]pyrene, benzo[a]fluoranthene, benzo[b]fluoranthene, benzo[j]fluoranthene, benzo[k]fluoranthene, dibenz[a,h]anthracene, dibenz[a,j]anthracene, olympicene, pentacene, perylene, picene, tetraphenylene, benz[a]anthracene, benzo[a]fluorene, benzo[c]phenanthrene, chrysene, fluoranthene, pyrene, tetracene, triphenylene, anthracene, fluorene, phenalene, and phenanthrene.

In regard to the method for manufacturing $MgB_2$ superconductor of the present invention, it is preferable that the polycyclic aromatic hydrocarbon is solid at room temperature and atmospheric pressure, and the melting point thereof is lower than the decomposition temperature. If the melting point of the polycyclic aromatic hydrocarbon is higher than the decomposition temperature, the hydrocarbon is decomposed before it melts, and the boron powder surface cannot be covered with the hydrocarbon liquid.

Furthermore, the ratio between the number of carbon atoms and the number of hydrogen atoms in the polycyclic aromatic hydrocarbon may be such that the ratio C:H is 1:0.5 to 1:0.8. In this case, it is desirable that the amount of carbon is larger than the amount of hydrogen in the polycyclic aromatic hydrocarbon. This is because while carbon is used to substitute boron sites, hydrogen becomes an impurity. Therefore, it is desirable that the amount of hydrogen is as small as possible.

In regard to the method for manufacturing $MgB_2$ superconductor of the present invention, it is preferable that the amount of addition of the polycyclic aromatic hydrocarbon is 0.05 mol % to 40 mol % relative to the theoretical amount or the amount of experimental production of $MgB_2$.

When the amount of the polycyclic aromatic hydrocarbon that is added to the B powder is changed, the Jc characteristics thus obtainable also change; however, since the Jc characteristics are superior in all cases compared to the case of not adding the polycyclic aromatic hydrocarbon, the ratio between the amount of the B powder and the amount of the polycyclic aromatic hydrocarbon to be added may be arbitrary. It is preferable that the surface of the boron powder can be covered by the hydrocarbon liquid.

In the method for manufacturing $MgB_2$ superconductor, it is preferable that a metal tube is packed with the mixture, and the packed metal tube is subjected to pressure molding and a heat treatment.

In the method for manufacturing $MgB_2$ superconductor, it is preferable that a metal tube is packed with the B powder covered with the polycyclic aromatic hydrocarbon and an Mg rod, and the packed metal tube is subjected to pressure molding and a heat treatment.

The $MgB_2$ superconductor of the present invention is an $MgB_2$ superconductor obtained by the method for manufacturing $MgB_2$ superconductor, the $MgB_2$ superconductor being an $MgB_2$ wire having one or plural $MgB_2$ cores.

In regard to the method for manufacturing $MgB_2$ superconductor of the present invention, it is preferable that the $MgB_2$ superconductor is a multi-core $MgB_2$ wire having plural $MgB_2$ cores.

Advantageous Effects of Invention

According to the method for manufacturing $MgB_2$ superconductor of the present invention, when a B powder coated with a polycyclic aromatic hydrocarbon is used as a raw material for the PIT method, uniform substitution of B sites with C occurs, and an $MgB_2$ wire having a high Jc and excellent uniformity of Jc can be obtained.

BRIEF DESCRIPTION OF DRAWINGS

FIG. 1 is an explanatory diagram for the production process for single core $MgB_2$ wire according to an internal Mg diffusion method as an embodiment of the present invention.

FIG. 4 is a diagram illustrating the magnetic field-dependency of the critical current density Jc at 4.2 K of the wire obtained in Example 2 of the present invention.

FIG. 5 is an explanatory diagram for the addition of coronene and the Jc-B curve in connection with the $MgB_2$ wire produced by a PIT method, which was obtained in an Example of the present invention.

FIG. 6 is a diagram illustrating the chemical formulae of the chemical substances used as the polycyclic aromatic hydrocarbon according to an embodiment of the present invention.

FIG. 7 is a diagram illustrating the chemical formulae of the chemical substances used as the polycyclic aromatic hydrocarbon according to an embodiment of the present invention.

FIG. 8 is a diagram illustrating the chemical formulae of the chemical substances used as the polycyclic aromatic hydrocarbon according to an embodiment of the present invention.

FIG. 9 is a diagram illustrating the chemical formulae of the chemical substances used as the polycyclic aromatic hydrocarbon according to an embodiment of the present invention.

FIG. 10 is a diagram illustrating the chemical formulae of the chemical substances used as the polycyclic aromatic hydrocarbon according to an embodiment of the present invention.

FIG. 11 is a diagram illustrating the chemical formulae of the chemical substances used as the polycyclic aromatic hydrocarbon according to an embodiment of the present invention.

DESCRIPTION OF EMBODIMENTS

Figure 2:
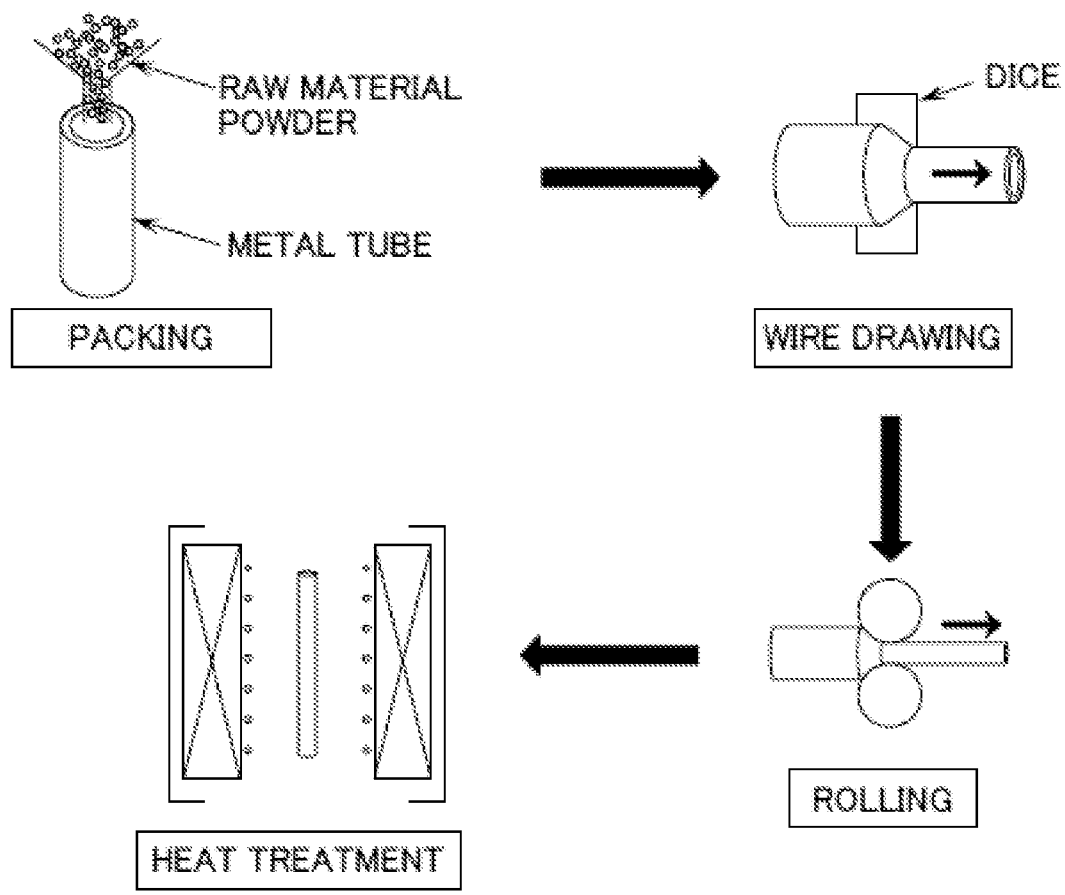
FIG. 2 is a diagram illustrating the production process for single core $MgB_2$ wire according to a powder-in-tube (PIT) method.

Hereinafter, embodiments of the present invention will be explained in detail using the drawings or tables. Meanwhile, for the terms used in the present specification, definitions thereof will be described below.

The "internal Mg diffusion method" is a method for manufacturing wire by disposing an Mg rod inside a metal tube, packing the gaps between the metal tube and the Mg rod with B powder, processing this composite into wire, and then heat-treating the wire.

The "powder-in-tube method" is a method for producing wire by packing a metal tube with a raw material powder of a superconductor, processing the composite into wire, and then heat-treating the wire.

The "critical current density Jc" refers to the maximum superconducting current density that can be passed per unit area of a superconducting wire. Usually, the critical current density refers to a value per unit area of the superconductor core in the wire.

In regard to the Mg powder, $MgH_2$ powder, and B powder that are used as raw materials, powders having purities or particle sizes similar to those of the conventional powders such as those described in Patent Literatures 1 to 3, which are related to the proposal of the present applicant, can be used by appropriately regulating the mixing ratio. For example, in regard to the particle size, the average particle size of the Mg powder or the $MgH_2$ powder is preferably in the range of 200 nm to 50 μm, and the average particle size of the B powder is preferably in the range of 0.2 μm to 1 μm. In regard to the mixing ratio, it is preferable that Mg or $MgH_2$ and B are mixed at a molar ratio in the range of Mg or $MgH_2$/B=0.5/2 to 1.5/2, and more preferably at a molar ratio in the range of 0.8/2 to 1.2/2. Then, appropriate amounts of a polycyclic aromatic hydrocarbon and SiC are added to the mixture of Mg or $MgH_2$ powder and B powder, and the resulting mixture can be sufficiently mixed in a ball mill or the like.

In regard to the polycyclic aromatic hydrocarbon, various compounds among those compounds having a carbocyclic or heterocyclic ring, each being tricyclic or higher-cyclic, may be considered, and the number of carbon atoms of the polycyclic aromatic hydrocarbon is not particularly limited; however, the number of carbon atoms is preferably in the range of 18 to 50. The polycyclic aromatic hydrocarbon may have various functional groups as long as the functional groups do not impair the operating effect of the present invention, and the polycyclic aromatic hydrocarbon can be appropriately selected in consideration of easy availability, handleability, price and the like. A typical example of the substituent is an alkyl group having 1 to 8 carbon atoms, and particularly 1 to 4 carbon atoms. More specific examples include coronene, anthracene, perylene and biphenyl disclosed in Table 1, Table 2 and FIG. 6 to FIG. 11; an alkyl-substitute carbocyclic aromatic hydrocarbon; and a heterocyclic aromatic hydrocarbon such as thiophene. Furthermore, in regard to the amount of addition of the polycyclic aromatic hydrocarbon, it is preferable to add the polycyclic aromatic hydrocarbon at a proportion of 0.05 mol % to 40 mol % relative to the theoretical amount or the amount of experimental production of $MgB_2$.

Meanwhile, in regard to the boiling points and the melting points of the polycyclic aromatic hydrocarbons (nanographenes) of Table 1 and Table 2, the database of SciFinder (American Chemical Society; https://scifinder.cas.org/scifinder/) may be referred to, and in a case in which there are no measured values, calculated values of the boiling point and the melting point may be used (Calculated using Advanced Chemistry Development (ACD/Labs) Software V11.02).

TABLE 1

| Name | Chemical formula | Melting point [° C.] | Boiling point [° C.] |
|---|---|---|---|
| Coronene (or superbenzene) | $C_{24}H_{12}$ | 438 | 525 |
| Anthanthrene | $C_{22}H_{12}$ | 261 | 497 |
| Benzo(ghi)perylene | $C_{22}H_{12}$ | 278 | 500 |
| Circulene | $C_{28}H_{14}$ | 295 | 604 |
| Corannulene | $C_{20}H_{10}$ | 268 | 438 |
| Dicoronylene | $C_{20}H_{10}$ | Not published | Not published |
| Diindenoperylene | $C_{32}H_{16}$ | Not published | >330 |
| Helicene | $C_{26}H_{16}$ | Not published | Not published |
| Heptacene | $C_{30}H_{18}$ | Not published | 677 |
| Hexacene | $C_{26}H_{16}$ | Not published | 604 |
| Kekulene | $C_{48}H_{24}$ | Not published | Not published |
| Ovalene | $C_{32}H_{14}$ | 475 | Not published |
| Zethrene | $C_{24}H_{14}$ | 262 | 583 |
| Benzopyrene | $C_{20}H_{12}$ | 179 | 495 |
| Benzo(a)pyrene | $C_{20}H_{12}$ | 179 | 495 |
| Benzo(e)pyrene | $C_{20}H_{12}$ | 178 | 493 |
| Benzo(a)fluoranthene | $C_{20}H_{12}$ | 150 | 468 |
| Benzo(b)fluoranthene | $C_{20}H_{12}$ | 168 | 481 |
| Benzo(j)fluoranthene | $C_{20}H_{12}$ | 165 | 480 |
| Benzo(k)fluoranthene | $C_{20}H_{12}$ | 217 | 480 |
| Dibenz(a,h)anthracene | $C_{22}H_{14}$ | 262 | 524 ± 17 |
| Dibenz(a,j)anthracene | $C_{22}H_{14}$ | 196 | 524 ± 17 |

TABLE 2

| Name | Chemical formula | Melting point [° C.] | Boiling point [° C.] |
|---|---|---|---|
| Olympicene | $C_{19}H_{12}$ | Not published | 511 |
| Pentacene | $C_{22}H_{14}$ | 268 | 524 ± 17 |
| Perylene | $C_{20}H_{12}$ | 276 | 497 |
| Picene | $C_{22}H_{14}$ | 366 | 519 |
| Tetraphenylene | $C_{24}H_{16}$ | 232 | 578 ± 17 |
| Benz(a)anthracene | $C_{18}H_{12}$ | 158 | 438 |
| Benzo(a)fluorene | $C_{17}H_{12}$ | 189.5 | 405 |
| Benzo(c)phenanthrene | $C_{18}H_{12}$ | 159 | 436 ± 12 |
| Chrysene | $C_{18}H_{12}$ | 254 | 448 |
| Fluoranthene | $C_{16}H_{10}$ | 110.8 | 375 |
| Pyrene | $C_{16}H_{10}$ | 145 | 404 |
| Tetracene | $C_{18}H_{12}$ | 357 | 437 ± 12 |
| Triphenylene | $C_{18}H_{12}$ | 198 | 438 |
| Anthracene | $C_{14}H_{10}$ | 218 | 340 |
| Fluorene | $C_{13}H_{10}$ | 116 | 295 |
| Phenalene | $C_{13}H_{10}$ | 70-75 | 290 |
| Phenanthrene | $C_{14}H_{10}$ | 101 | 332 |

A mixture such as described above is processed into a bulk material or a wire, and methods and conditions similar to the methods and conditions of conventional cases may be employed. A bulk material can be produced by pressure molding and heat treating the mixture, and for example, pressing using a conventional mold or the like may be used, while the pressure is preferably 100 kg/cm² to 300 kg/cm². A wire can be produced by, for example, packing the mixture in a metal tube made of iron or the like, processing the metal tube into tape or wire with a mechanical rolling or the like, and then heat treating the tape or wire. Regarding the conditions, conditions similar to the conditions of conventional cases may be employed. That is, according to the usage, the mixture can be heat-treated under the conditions of a temperature and a time period sufficient to obtain the $MgB_2$ superconducting phase, in an inert atmosphere such as argon or a vacuum.

Furthermore, the metal tube used, the heat treatment temperature, and the heat treatment time are not intrinsic to the substitution of B sites with C, and therefore, various metal tubes, heat treatment temperatures, and heat treatment times can be selected.

The $MgB_2$ superconductor of the present invention obtained as described above is useful for enhancing the capacity of superconducting linear motor cars, MRI medical diagnostic apparatuses, semiconductor single crystal pulling apparatuses, superconducting energy storages, superconducting rotating machines, superconducting transformers, superconducting cables and the like.

Thus, the present invention will be explained in more detail by describing Examples below. The present invention is not intended to be limited to the following Examples.

EXAMPLES

Example 1

B powder and a 5 mol % solid powder of coronene: $C_{24}H_{12}$ as C atoms were sufficiently mixed, and the mixture was vacuum-sealed in a quartz tube. This was heat-treated for 5 minutes at 440° C., which was a temperature higher than or equal to the melting point of coronene: $C_{24}H_{12}$, and then the quartz tube was cooled to room temperature. During the heat treatment, coronene: $C_{24}H_{12}$ melted and infiltrated into the B powder, and the coronene covered (coated) the surface of the B powder. Using this powder coated with coronene: $C_{24}H_{12}$, $MgB_2$ wire was produced by an internal Mg diffusion method (FIG. 1). An Mg rod having a diameter of 2 mm was disposed at the center of an iron tube having an inner diameter of 4 mm and an outer diameter of 6 mm, and the gap between the Mg rod and the iron tube was packed with this B powder coated with $C_{24}H_{12}$. Thereafter, the packed iron tube was processed into a wire having a diameter of 0.6 mm by means of a groove rolling and wire drawing. This wire was subjected to a heat treatment for 6 hours at 670° C. in an argon atmosphere, and thus $MgB_2$ superconducting wire was obtained. Mg diffused into the B layer during the heat treatment, and Mg reacted with B to produce $MgB_2$. At that time, $C_{24}H_{12}$ is decomposed, and a portion of carbon substituted for B of $MgB_2$. Furthermore, for a comparison, a mixed powder obtained by adding 10 mol % of SiC nanoparticles to B, and an additive-free B powder were used to produce $MgB_2$ wires according to the internal Mg diffusion method under the same conditions.

Figure 3:
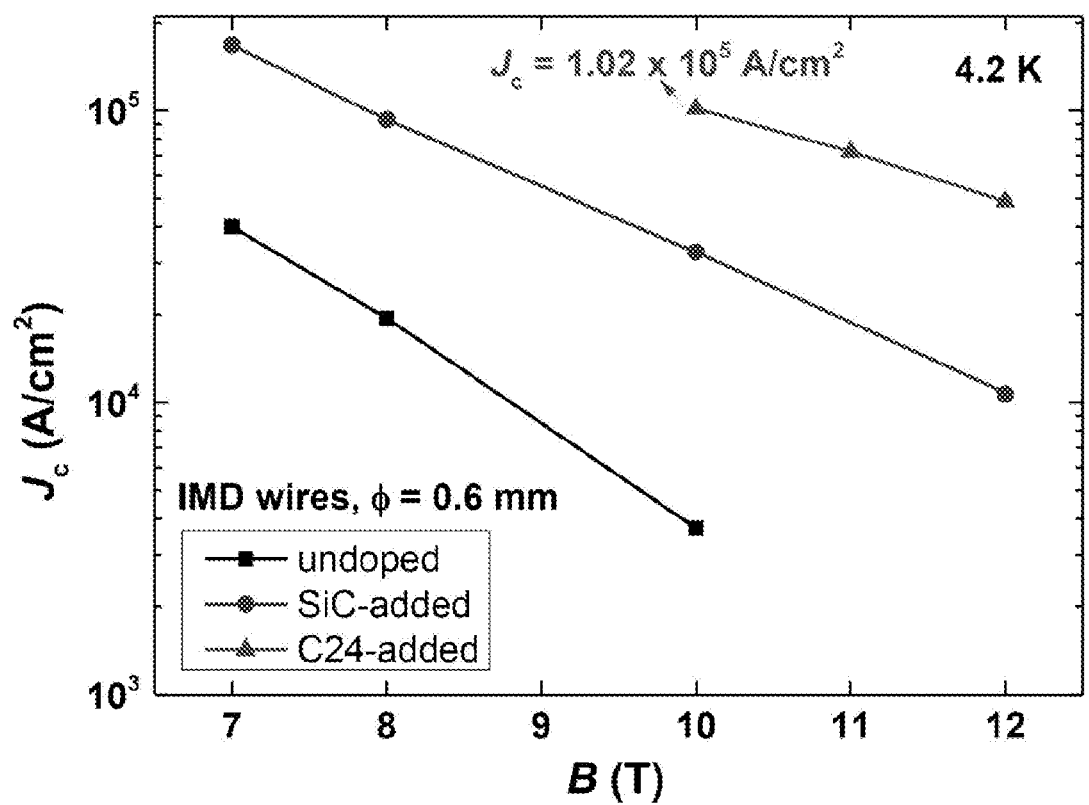
FIG. 3 is a diagram illustrating the magnetic field-dependency of the critical current density Jc at 4.2 K of the wire obtained in Example 1 of the present invention.

For these wires, the critical current density Jc was measured at 4.2 K in various magnetic fields. The results are presented in FIG. 3. As can be seen from this, the $MgB_2$ wire produced using a B powder coated with coronene: $C_{24}H_{12}$ had its Jc increased to a large extent compared to the wire produced by adding SiC or the additive-free wire. Thus, the superiority of the coronene: $C_{24}H_{12}$ coating for the B powder raw material became clearly known. In regard to the addition of SiC, $Mg_2Si$ is precipitated out as an impurity inside the $MgB_2$ layer after the heat treatment, and this becomes an inhibitory factor for the superconducting current. Thus, a sufficiently high Jc may not be obtained. On the other hand, in regard to the addition of coronene: $C_{24}H_{12}$, it is speculated that since a precipitate of such an impurity is not incorporated, a Jc that is high as such may be obtained.

Example 2

A B powder coated with coronene: $C_{24}H_{12}$ was produced in the same manner as in Example 1, and $MgB_2$ wire was produced by a powder-in-tube (PIT) method (FIG. 2). The B powder coated with coronene: $C_{24}H_{12}$, and Mg powder were sufficiently mixed at a molar ratio of 2:1, and an iron tube having an inner diameter of 4 mm and an outer diameter of 6 mm was packed with this mixture. This powder-packed iron tube was processed into a wire having a diameter of 1 mm by means of a groove rolling and wire drawing. This wire was subjected to a heat treatment for one hour at 700° C. in an argon atmosphere, and thus $MgB_2$ superconducting wire was produced. The Mg and B powder thus packed in the iron tube reacted with each other by the heat treatment, and thus $MgB_2$ was produced. At that time, $C_{24}H_{12}$ was decomposed, and a portion of carbon substituted for B of $MgB_2$. Furthermore, similarly to Example 1, an $MgB_2$ wire was produced, for a comparison, according to the PIT method under the same conditions, using a mixed powder obtained by adding 10 mol % of SiC nanoparticles to a mixed powder of B and Mg, and an additive-free B powder.

For these wires, the critical current density Jc was measured at 4.2 K in various magnetic fields. The results are presented in FIG. 4. As can be seen from this, the $MgB_2$ wire produced using a B powder coated with coronene: $C_{24}H_{12}$ had its Jc increased to a large extent compared to the wire produced by adding SiC or the additive-free wire. Thus, the superiority of the coronene: $C_{24}H_{12}$ coating for the B powder raw material became clearly known. In regard to the addition of SiC, $Mg_2Si$ is precipitated out as an impurity inside the $MgB_2$ layer after the heat treatment, and this becomes an inhibitory factor for the superconducting current. Thus, a sufficiently high Jc may not be obtained. On the other hand, in regard to the addition of coronene: $C_{24}H_{12}$, it is speculated that since a precipitate of such an impurity is not incorporated, a Jc that is high as such may be obtained.

FIG. 5 is an explanatory diagram for the addition of coronene: $C_{24}H_{12}$ and the Jc-B curve for the $MgB_2$ wire produced by a PIT method, which was obtained in an Example of the present invention. The wire diameter Φ of the $MgB_2$ wire produced by the PIT method was 1.0 mm, and the heat treatment temperature was 700° C., while the heat treatment time was 1 hour. The addition of coronene: $C_{24}H_{12}$ was adjusted to 4 types, namely, no addition, 2% by mass, 5% by mass, and 10% by mass. With regard to the critical current density Jc at 4.2 K, which is the temperature of liquid helium, in a case in which the amount of addition of coronene: $C_{24}H_{12}$ was 10% by mass in a magnetic field of 10 T, the critical current density Jc was $1.8 \times 10^4$ [A/cm$^2$]. As the amount of addition of coronene: $C_{24}H_{12}$ increased, the critical current density Jc increased. Furthermore, measured values of the critical temperature Tc are shown in Table 3. As the amount of addition of coronene: $C_{24}H_{12}$ increased, the critical temperature Tc decreased. However, there is a sufficient margin to the critical temperature at 20 K, which temperature can be easily achieved by refrigerator conduction cooling. Therefore, even if liquid helium is not used, superconductivity can be realized, and even the current circumstances for the supply of liquid helium can be safely coped with.

TABLE 3

| | Change in axial length a (nm) | X in Mg $(B_{1-x}C_x)_2$ | $T_c$ (K): calculated value induced from reference value [x] | $T_c$ (K): measured value induced from resistance value |
|---|---|---|---|---|
| No addition | — | — | 38.8 | 38 |
| 2% $C_{24}H_{12}$ | 0.0005 | 0.016 | 38 | 36.9 |
| 5% $C_{24}H_{12}$ | 0.0014 | 0.045 | 35 | 35.1 |
| 10% $C_{24}H_{12}$ | 0.0015 | 0.048 | 34.4 | 34.2 |

Particular embodiments of the present invention have been illustrated and explained; however, it will be obvious to those ordinarily skilled in the art that various other modifications and alterations can be made without departing from the spirit and the scope of the present invention. Therefore, the present invention includes all of such modifications and alterations.

INDUSTRIAL APPLICABILITY

According to the method for manufacturing $MgB_2$ superconductor of the present invention, addition of a polycyclic aromatic hydrocarbon with excellent uniformity to $MgB_2$ superconducting wire can be realized, and thereby, an $MgB_2$ superconducting wire having high critical current density (Jc) characteristics and a critical current density (Jc) with less fluctuation can be provided. The $MgB_2$ superconductor thus produced is suitable for the use in superconducting linear motor cars, MRI medical diagnostic apparatuses, semiconductor single crystal pulling apparatuses, superconducting energy storages, superconducting rotating machines, superconducting transformers, superconducting cables, and the like.

The invention claimed is:

1. A method for manufacturing an $MgB_2$ superconductor comprising:
   (I) adding a polycyclic aromatic hydrocarbon to a B powder, while heating to a temperature higher than or equal to the melting point of the polycyclic aromatic hydrocarbon at the time of this addition, and thereby covering a surface of the B powder with the polycyclic aromatic hydrocarbon;
   (IIa) mixing the B powder having the surface covered with the polycyclic aromatic hydrocarbon, with an Mg powder or an $MgH_2$ powder, and then packing a metal tube with the resulting mixture; or
   (IIb) packing a metal tube with the B powder covered with the polycyclic aromatic hydrocarbon and an Mg rod; and
   (III) pressure molding and heat-treating the packed metal tube, thereby producing the $MgB_2$ superconductor.

2. The method for manufacturing an $MgB_2$ superconductor according to claim 1, wherein the polycyclic aromatic hydrocarbon is at least one selected from the group consisting of coronene, anthanthrene, benzo(ghi)perylene, circulenes, corannulene, dicoronylene, diindenoperylene, helicene, heptacene, hexacene, kekulene, ovalene, zethrene, benzo[a]pyrene, benzo[e]pyrene, benzo[a]fluoranthene, benzo[b]fluoranthene, benzo[j]fluoranthene, benzo[k]fluoranthene, dibenz[a,h]anthracene, dibenz[a,j]anthracene, olympicene, pentacene, perylene, picene, tetraphenylene, benz[a]anthracene, benzo[a]fluorene, benzo[c]phenanthrene, chrysene, fluoranthene, pyrene, tetracene, triphenylene, anthracene, fluorene, phenalene, and phenanthrene.

3. The method for manufacturing an $MgB_2$ superconductor according to claim 1, wherein the polycyclic aromatic hydrocarbon is solid at room temperature and atmospheric pressure and has a melting point that is lower than the decomposition temperature, and a ratio between the number of carbon atoms and the number of hydrogen atoms in the polycyclic aromatic hydrocarbon is such that the ratio C:H is in the range of 1:0.5 to 1:0.8.

4. The method for manufacturing an $MgB_2$ superconductor according to claim 1, wherein an amount of addition of the polycyclic aromatic hydrocarbon is in the range of 0.05 mol % to 40 mol % relative to a theoretical amount or an amount of experimental production of $MgB_2$.

5. The method for manufacturing an $MgB_2$ superconductor according to claim 1, comprising steps (I), (IIa) and (III).

6. The method for manufacturing an $MgB_2$ superconductor according to claim 1, comprising steps (I), (IIb) and (III).

* * * * *